(12) United States Patent
Yoshinaga et al.

(10) Patent No.: US 7,550,308 B2
(45) Date of Patent: Jun. 23, 2009

(54) TRANSISTOR AND DISPLAY AND METHOD OF DRIVING THE SAME

(75) Inventors: Hideki Yoshinaga, Yokohama (JP); Hideo Mori, Yokohama (JP); Nobutaka Ukigaya, Yokohama (JP); Nozomu Izumi, Yokohama (JP)

(73) Assignee: Canan Kabushiki Kaisha, Tokyo (JP)

( * ) Notice: Subject to any disclaimer, the term of this patent is extended or adjusted under 35 U.S.C. 154(b) by 349 days.

(21) Appl. No.: 11/441,028

(22) Filed: May 26, 2006

(65) Prior Publication Data

US 2006/0273348 A1 Dec. 7, 2006

(30) Foreign Application Priority Data

Jun. 3, 2005 (JP) .............................. 2005-164028

(51) Int. Cl.
*H01L 21/00* (2006.01)
(52) U.S. Cl. .............................. 438/34; 257/59; 257/72; 257/E21.413; 438/587
(58) Field of Classification Search .................... 257/59, 257/72, E21.413; 438/34, 587
See application file for complete search history.

(56) References Cited

U.S. PATENT DOCUMENTS

| | | | | |
|---|---|---|---|---|
| 3,612,758 A | | 10/1971 | Evans et al. .............. | 178/5.4 R |
| 5,075,674 A | * | 12/1991 | Katayama et al. ............. | 345/93 |
| 5,414,283 A | * | 5/1995 | den Boer et al. ............... | 257/59 |
| 5,981,973 A | * | 11/1999 | Matsuzaki et al. ............. | 257/66 |
| 6,274,884 B1 | * | 8/2001 | Lee et al. ....................... | 257/57 |
| 6,664,569 B2 | * | 12/2003 | Moon ............................ | 257/72 |
| 6,797,982 B2 | * | 9/2004 | Okada et al. ................... | 257/59 |
| 6,911,666 B2 | * | 6/2005 | Voutsas ........................ | 257/40 |
| 2004/0195568 A1 | * | 10/2004 | Okumura ....................... | 257/59 |

FOREIGN PATENT DOCUMENTS

| | | |
|---|---|---|
| JP | 9-179106 | 7/1997 |
| JP | 9-211499 | 8/1997 |

* cited by examiner

*Primary Examiner*—Howard Weiss
*Assistant Examiner*—John C Ingham
(74) *Attorney, Agent, or Firm*—Fitzpatrick, Cella, Harper & Scinto

(57) ABSTRACT

A field-effect transistor including an electrically conductive substrate; a first insulating film coating the electrically conductive substrate; a gate electrode disposed on the electrically conductive substrate with the first insulating film interposed therebetween; a source electrode; a drain electrode opposing the source electrode with the channel therebetween; a second insulating film covering the gate electrode; and a semiconductor layer having a width larger than a width of the gate electrode in the channel width direction and being partly provided on the gate electrode with the second insulating film interposed therebetween so that the gate electrode, the second insulating film, and the semiconductor layer are laminated in the channel.

1 Claim, 8 Drawing Sheets

TRANSISTOR AND DISPLAY AND METHOD OF DRIVING THE SAME

BACKGROUND OF THE INVENTION

1. Field of the Invention

The present invention relates to transistors, transistor array panels having a matrix array of the transistors, and active-matrix displays using the transistor array panels. The present invention further relates to methods for driving the active-matrix display.

2. Description of the Related Art

The need for flat-panel displays of low power consumption is increasing with the development of information equipment, and the research and development of displays which meet this need is being actively conducted. In particular, wearable PCs and electronic personal organizers are often intended to be used out of doors and consequently power-thrifty and space-saving models are desired. A liquid-crystal display is one of such desirable displays.

Most liquid crystals used in liquid-crystal displays do not have a memory function for retaining the state of the display when its power is turned off. Therefore, the liquid crystals are necessarily supplied with voltage for the duration of display. On the other hand, it is difficult to secure the reliability of liquid crystals having a memory function when they are applied to wearable PCs or the like which are supposed to be used in various environments. Recently, such liquid crystals have been gradually put to practical use, but they still have many problems.

An electrophoretic display disclosed in U.S. Pat. No. 3,612,758 is an example of a lightweight flat display having a memory function. That display includes a pair of substrates disposed so as to have a predetermined gap therebetween; an insulating liquid filled between the substrates; a large number of colored charged electrophoretic particles dispersed in the insulating liquid; and display electrodes disposed in each pixel so as to be along the substrates.

In this display, since the colored charged electrophoretic particles are positively or negatively charged, the particles are adsorbed on display electrodes depending on the polarity of the voltage applied to the display electrodes. In the state that the colored particles are adsorbed on the top electrodes, the colored particles are seen; and in the state that the colored particles are adsorbed on the bottom electrodes, the insulating liquid is seen. The state can be controlled by adjusting an applied voltage. Thus, various images can be displayed. Such a display is known as a "vertical-movement-type" display.

Another example of the electrophoretic display is disclosed in Japanese Patent Laid-Open No. 9-211499. FIGS. 7A and 7B are cross-sectional views illustrating the structure of this electrophoretic display, wherein a pixel is composed of a first substrate 31 and a second substrate 32 disposed so as to oppose each other, and spacers 33 for maintaining a predetermined distance between these two substrates. In the space defined by the substrates and the spacers, an insulating fluid 34 and black electrophoretic particles 35 are encapsulated. The insulating liquid 34 is transparent.

The second substrate 32 is provided with a first electrode 36 and second electrodes 37 for driving a display device, and an insulating film 38 covers them. The first electrode 36 is disposed over the entire pixel and also serves as a reflective layer for reflecting incident light. The second electrodes 37 are disposed along the spacers 33 and may be colored black so as to also serve as a light-shielding layer.

FIGS. 7A and 7B show the pixel in two different states of displays.

FIG. 7A shows the pixel in the state when a voltage of a polarity opposite to that of the electrophoretic particles 35 is applied to the first electrode 36 and a voltage of a polarity identical to that of the electrophoretic particles 35 is applied to the second electrodes 37. The electrophoretic particles 35 are drawn toward the first electrode 36 to cover the top face thereof and the pixel is displayed in black. This state is converted to the state shown in FIG. 7B by inverting the polarities of the first electrode 36 and the second electrodes 37. The electrophoretic particles 35 are drawn toward the second electrodes 37 and the pixel is displayed as white. Thus, an image is displayed by controlling the polarity and amplitude of the voltage applied to the electrodes for each pixel.

In order to drive the electrophoretic display, the display devices constituting the pixel are each provided with a thin-film transistor (TFT) to form an active matrix array (simply referred to as TFT array). The TFT active matrix array is disposed in or under the second substrate 32 shown in FIGS. 7A and 7B.

The TFT may have various structures such as a bottom-gate TFT structure, which has a gate electrode disposed below an active layer on which a channel is formed; a top-gate TFT structure; and a plate TFT structure.

FIG. 8 is a cross-sectional view illustrating the bottom-gate TFT structure.

The TFT includes a gate electrode 12 on a glass substrate 10; a gate insulating film 14 on the gate electrode 12; an amorphous semiconductor layer 15 on the gate insulating film 14; and a source electrode 16 and a drain electrode 17 connected through the ohmic contact layer 19 disposed on the amorphous semiconductor layer 15. Additionally, a channel protective film 18 for covering the exposed face of the amorphous semiconductor layer 15 is disposed on the source electrode 16 and the drain electrode 17.

The display device shown in FIGS. 7A and 7B is provided on the TFT (not shown in FIG. 8). The first electrode 36 or the second electrode 37 is connected to the drain electrode via a contact hole provided in the channel protective film 18. Another electrode which is not connected to the drain electrode is set at a common electric potential.

In the right area of FIG. 8, a cross-section of a storage capacitor is drawn. The storage capacitor is provided for retaining the voltage of the display device.

A storage capacitor (Cs) electrode 13 is disposed on the substrate 10; and on the storage capacitor electrode 13, a gate insulating film 14, an amorphous semiconductor layer 15, an ohmic contact layer 19, and a drain electrode 17 are laminated. The drain electrode 17 and the storage capacitor electrode 13 as a counter electrode constitute a capacitor, i.e., a storage capacitor by interposing the ohmic contact layer 19, the amorphous semiconductor layer 15, and the gate insulating film 14 therebetween.

The storage capacitor may not have the ohmic contact layer 19 and the amorphous semiconductor layer 15, that is, the storage capacitor may be produced by sandwiching only the gate insulating film 14 between the drain electrode 17 and the storage capacitor electrode 13.

FIG. 9 is a layout plan view of a TFT and a display device. The horizontal direction in the drawing is set as an X-direction and the vertical direction is set as a Y-direction.

Patterns of a gate electrode 12 and a storage capacitor electrode 13 are formed in the same layer on a glass substrate 10 with the same material. On the patterns, a gate insulating film (not shown) is formed to cover the whole area, and an amorphous semiconductor layer 15a (15b) having the same pattern as that of an ohmic contact layer (not shown) is further formed. On the amorphous semiconductor layer 15a (15b), through the ohmic contact layer 19, patterns of a source electrode 16a (16b) and a drain electrode 17a (17b) are formed in the same layer with the same material.

Furthermore, a channel protective film 18 is formed on the whole area, and a pixel electrode 20 is formed thereon. Here, the first electrode 36 disposed over the entire pixel in FIGS. 7A and 7B corresponds to a pixel electrode 20.

The drain electrode 17a (17b) is formed as a rectangular pattern on the storage capacitor electrode 13 to constitute a storage capacitor. The contact of the drain electrode 17a (17b) with the pixel electrode 20 is not shown, but the drain electrode 17a (17b) is in contact with the pixel electrode 20 via a contact hole formed in the channel protective film 18 disposed on the drain electrode.

The amorphous semiconductor layer 15b, the source electrode 16b, and the drain electrode 17b belong to the TFT of the adjacent pixel. If the amorphous semiconductor layers 15a and 15b of the adjacent pixels are connected to each other to form a band between the TFT, the electrode potential of the drain electrode 17a is affected by the source electrode 16b. In order to avoid this, the patterns of the amorphous semiconductor layers 15a and 15b are disconnected from each other.

The source electrode 16a (16b) extends in the Y-direction and is connected to other TFTs at the top and the bottom thereof. The drain electrodes 17a and 17b are opposite to the source electrodes 16a and 16b, respectively. A portion where the amorphous semiconductor layer lies between the opposing drain electrode 17a and source electrode 16a is called a channel hereinafter. Since a gate electrode is disposed under the amorphous semiconductor layer of the channel through a gate insulating film, the electrical conductivity of the channel, i.e., voltage-current characteristic between the source and the drain electrodes, is controlled by the potential of the gate electrode.

In this specification, the width of a portion where the amorphous semiconductor layer 15a (15b) lies is referred to as the channel width and the distance between the opposing drain electrode and source electrode so as to have the channel therebetween is referred to as the channel length.

In FIG. 9, the drain electrode 17a (17b) is formed with a pattern different from those of the amorphous semiconductor layer 15a (15b) and the ohmic contact layer 19. However, the drain electrode may be formed with the same pattern as that of the amorphous semiconductor layer 15a (15b) and the ohmic contact layer 19 by laminating three layers of the amorphous semiconductor layer, ohmic contact layer, and drain electrode and then performing a photolithography process for one mask. In such a case, the amorphous semiconductor layer 15a is formed not only at the portion shown by a broken line in FIG. 9 but also under the source electrode 16a (16b) and the drain electrode 17a (17b).

As shown in FIG. 9, the pattern of the amorphous semiconductor layer 15a (15b) is formed within the region of the gate electrode 12 so as to be smaller than that of the gate electrode 12. This provides an allowance (hereinafter referred to as a margin) for displacement of the amorphous semiconductor layer 15a (15b).

In FIG. 9, the reference character Ma denotes a margin for displacement of the amorphous semiconductor layer 15a in the Y-direction and the reference character Mb denotes a margin for displacement of the amorphous semiconductor layer 15a in the X-direction.

If the pattern of the amorphous semiconductor layer 15a is shifted more than ±Mb in the X-direction, the contact area of the amorphous semiconductor layer 15a with the source electrode or the drain electrode is decreased; which causes an increase in the resistance between the source and drain electrodes.

If the pattern of the amorphous semiconductor layer 15a is shifted more than ±Ma in the Y-direction, the pattern of the amorphous semiconductor 15a lies outside the gate electrode 12; which causes not only a decrease in the channel width which can be controlled by adjusting the gate voltage but also an increase in the leakage current of the TFT by the occurrence of an uncontrollable semiconductor region in the channel. As a result, a desired voltage-current characteristic cannot be achieved.

These margins for the displacement are allowances for error in placement of patterns in lithography and etching processes. The margin is determined in consideration of the positioning accuracy between the amorphous semiconductor layer and a photomask in a lithography process of forming the amorphous semiconductor layer and the degree of expansion/contraction of the substrate caused by a heating process.

As long as the displacement is within the margin, the width (W) and the length (L) of the channel-forming area on the TFT and the ratio (W/L) are not changed. Therefore, the voltage-current characteristic of the TFT is constant.

Recently, a display using an electrophoretic device is adopted instead of paper. The display is thin and heavy duty. Since the display is treated as a piece of paper, a technology for forming a TFT array on a thin metal or plastic substrate instead of the existing glass substrate is desired.

One reason for using the metal substrate is that it is resistant to heating in a TFT-manufacturing process. Another reason is that a metal substrate in the form of a thin foil can be inserted into a narrow container by being rolled up as a sheet of paper; which enhances the convenience of a display using the substrate.

Japanese Patent Laid-Open No. 9-179106 discloses a TFT array formed on a metal substrate, in particular, a stainless steel substrate such as SUS420 (hereinafter abbreviated as SUS).

However, since the coefficient of linear expansion of SUS is higher than that of glass, it is difficult to form a TFT array having high-resolution patterns.

The coefficient ($\alpha$) of linear expansion of SUS is higher than twice the coefficient of glass ($\alpha=3\times10^{-6}$/K to $5\times10^{-6}$/K: glass with a low coefficient of linear expansion). Therefore, since the size of the SUS substrate is largely changed by the heating and cooling during the manufacture process, the margin for displacement must be broad. As a result, the area necessary for the formation of the TFT becomes large. Therefore, it is difficult to produce a display with high resolution. Additionally, the storage capacitor is decreased and the parasitic capacitor is increased; which are problems.

SUMMARY OF THE INVENTION

The present invention resolves the above-mentioned problems of the conventional technologies, and provides a display with high resolution by using a substrate, such as SUS, other than glass.

A first aspect of the present invention provides a field-effect transistor including:

an electrically conductive substrate;

a first insulating film coating the electrically conductive substrate;

a gate electrode disposed on the electrically conductive substrate with the first insulating film interposed therebetween;

a second insulating film covering the gate electrode;

a source electrode;

a drain electrode opposing the source electrode with a channel therebetween; and a semiconductor layer having a width larger than a width of the gate electrode in the channel width direction and being partly provided on the gate electrode with the second insulating film interposed therebetween so that the gate electrode, the second insulating film, and the semiconductor layer are laminated in the channel.

A second aspect of the present invention provides a transistor array panel including:

an electrically conductive substrate having a surface coated with a first insulating film;

a plurality of field-effect transistors arrayed on the surface of the electrically conductive substrate in the form of a matrix, the field-effect transistors each including: a gate electrode; a second insulating film covering the gate electrode; a source electrode; a drain electrode opposing the source electrode with a channel therebetween; and a semiconductor layer having a width larger than a width of the gate electrode in the channel width direction and being partly provided on the gate electrode with the second insulating film interposed therebetween so that the gate electrode, the second insulating film, and the semiconductor layer are laminated in the channel; and wiring for applying a voltage to the electrically conductive substrate.

A third aspect of the present invention provides a display including:

a display panel including:

an electrically conductive substrate having a surface coated with a first insulating film; and a plurality of sets of a field-effect transistor, a pixel electrode connected to the field-effect transistor, and a display device driven by the pixel electrode, the plurality of the sets being arrayed on the surface of the electrically conductive substrate in the form of a matrix, the field-effect transistor including: a gate electrode; a second insulating film covering the gate electrode; a source electrode; a drain electrode opposing the source electrode with a channel therebetween; and a semiconductor layer having a width larger than a width of the gate electrode in the channel width direction and being partly provided on the gate electrode with the second insulating film interposed therebetween so that the gate electrode, the second insulating film, and the semiconductor layer are laminated in the channel;

a gate-line-driving circuit for supplying a scanning signal voltage to the gate electrode;

a source-line-driving circuit for supplying an image signal voltage to the source electrode; and a substrate-voltage-generating circuit for supplying a voltage for commonly controlling all field-effect transistors of the sets arrayed in the form of a matrix on the electrically conductive substrate.

A fourth aspect of the present invention provides a method for driving the display according to the third aspect of the present invention. The method includes the step of placing each field-effect transistor, of the sets arrayed in the form of a matrix, in a state in which the field-effect transistor is controlled by a voltage applied to the gate electrode by supplying a voltage to the electrically conductive substrate from the substrate-voltage-generating circuit for the duration of time that the gate-line-driving circuit is supplying a scanning signal voltage to the gate electrode.

Further features of the present invention will become apparent from the following description of exemplary embodiments with reference to the attached drawings.

DESCRIPTION OF THE EMBODIMENTS

First Embodiment

In this embodiment, a SUS substrate is used as a thin metal plate for a substrate. Additionally, a TFT is a bottom-gate structure which has a gate electrode below, a gate insulating layer and a semiconductor layer laminated on the gate electrode, and source and drain electrodes on the lamination.

Figure 1A:
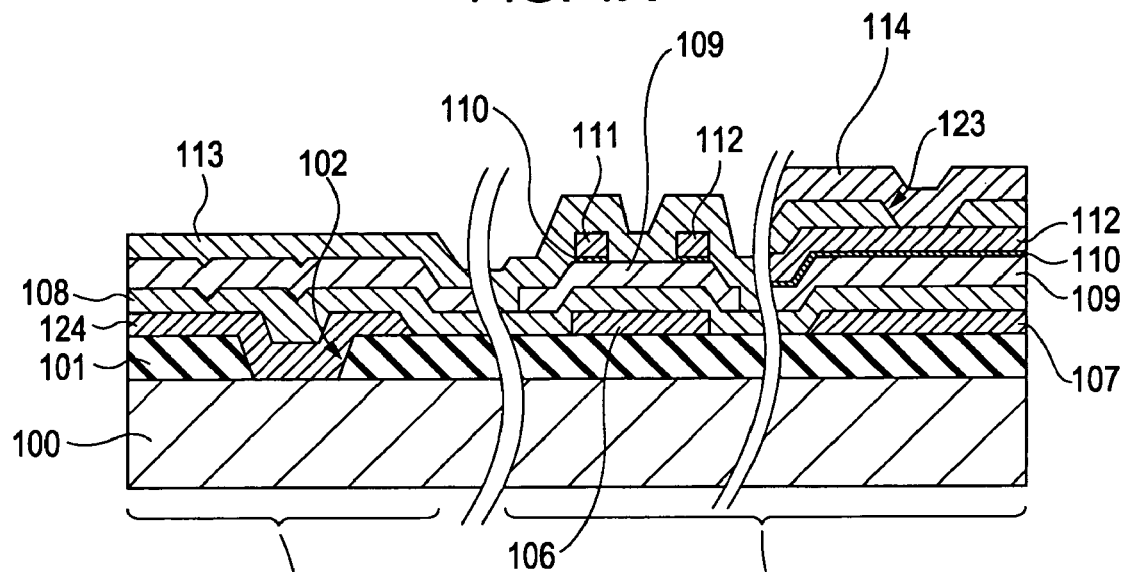
FIG. 1A is a diagram schematically showing a cross section of a transistor according to a first embodiment of the present invention.
Figure 1B:
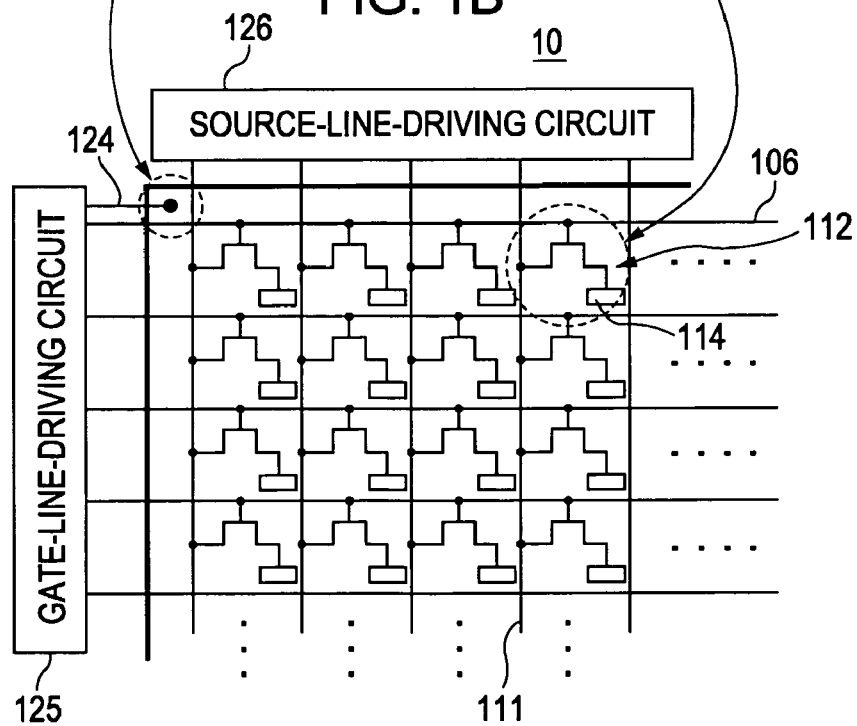
FIG. 1B is a schematic diagram showing a circuit structure of a transistor array panel according to the present invention.

FIG. 1A is a schematic diagram of a cross section of a transistor part of a transistor array panel 10 (referred to as a TFT array panel when the transistor is a TFT) using an electrically conductive substrate for a display according to the present invention. FIG. 1B is a plan view showing a circuit structure of the TFT array panel 10.

The left area of FIG. 1A shows a cross section of the upper left portion of the TFT array panel 10, where wiring 124 for setting a potential of a SUS substrate 100 is connected to the SUS substrate 100.

The center area of FIG. 1A shows a cross section of a TFT-forming region, where a gate electrode 106, an insulating film 108, an amorphous semiconductor layer 109, a source electrode 111, and a drain electrode 112 constitute a field-effect transistor.

The right area of FIG. 1A shows a cross section of a storage-capacitor-forming region.

The surface of a substrate 100 formed of SUS420 (hereinafter referred to as SUS substrate) is coated with a first insulating layer 101 formed of a SiN film or the like. On the insulating layer 101, wiring 124 for setting a potential of the substrate, the gate electrode 106 of the TFT, and a storage capacitor electrode 107 are provided in the same layer. The wiring and electrodes are formed of Al—Nd as an electrically conductive film with a low resistivity.

The wiring and electrodes are provided by forming a Al—Nd film on the insulating layer 101 and carrying out photolithography and etching. The wiring and electrodes may be formed of elemental Al, but Al—Nd having a melting point higher than that of elemental Al is more suitable when a heating process at a temperature exceeding the melting point of Al is conducted afterward. Cr and Ta, instead of Al—Nd, may be used as a metal having a melting point higher than that of Al.

The gate electrode 106, the storage capacitor electrode 107, and the wiring 124 for setting a potential of the substrate are covered with the second insulating film (SiN film) 108. The SiN film 108 serves as a gate insulating film of the TFT.

In the TFT shown in the center area of FIG. 1A, an amorphous semiconductor layer 109 serving as an active layer and an ohmic contact layer 110 are disposed on the SiN film 108 in this order. A source electrode 111 and a drain electrode 112 are disposed on the ohmic contact layer 110. Furthermore, the whole area is coated with a protective film (SiN film) 113, and a pixel electrode 114 is connected to the drain electrode 112 via a contact hole 123 provided in the protective film 113.

As shown in FIG. 1B, in a TFT array panel 10, a plurality of sets of the TFT and the pixel electrode 114 are arrayed to form a matrix and the gate electrodes 106 and the source electrodes 111 are disposed in a reticular pattern to connect each set.

The gate electrode 106 serves as a scanning signal line and is connected to a gate-line-driving circuit 125. The source electrode 111 serves as an image signal line for sending image information and is connected to a source-line-driving circuit 126. The drain electrode 112 of the TFT is connected to the pixel electrode 114. Sets of the TFT and the pixel electrode 114 are arrayed in the form of a matrix to constitute a display panel.

The gate-line-driving circuit 125 applies a voltage to the gate electrode 106 of the TFT to control a conductive/non-conductive state (ON/OFF) of the TFT. In this embodiment, the gate-line-driving circuit 125 supplies a voltage of +20V to the gate electrode 106 to turn the TFT ON and applies a voltage of −20 V to the gate electrode 106 to turn the TFT OFF. Hereinafter, the voltage for turning the TFT ON is referred to as an on-voltage and the voltage for turning the TFT OFF is referred to as an off-voltage.

The source-line-driving circuit 126 supplies a voltage of 0 to 15 V according to image information to the source electrodes 111 serving as a source signal line of the TFT.

In this embodiment, the wiring 124 is provided for applying a potential to the SUS substrate 100. The wiring 124 is supplied with a voltage from the gate-line-driving circuit 125 and is connected to the SUS substrate 100 via a contact hole 102 provided in the substrate insulating layer 101 at the upper left part of the TFT array panel. The potential of the SUS substrate 100 is set by this wiring 124. The wiring 124 may be connected to the SUS substrate 100 at a side face or a back side of the SUS substrate 100.

As described below, the SUS substrate 100 constitutes a gate electrode of another transistor other than the gate electrode 106 in a channel part of the TFT. The potential applied to the SUS substrate 100 functions as a gate voltage of this transistor and controls the current flowing between the source electrode 111 and the drain electrode 112.

Figure 2:
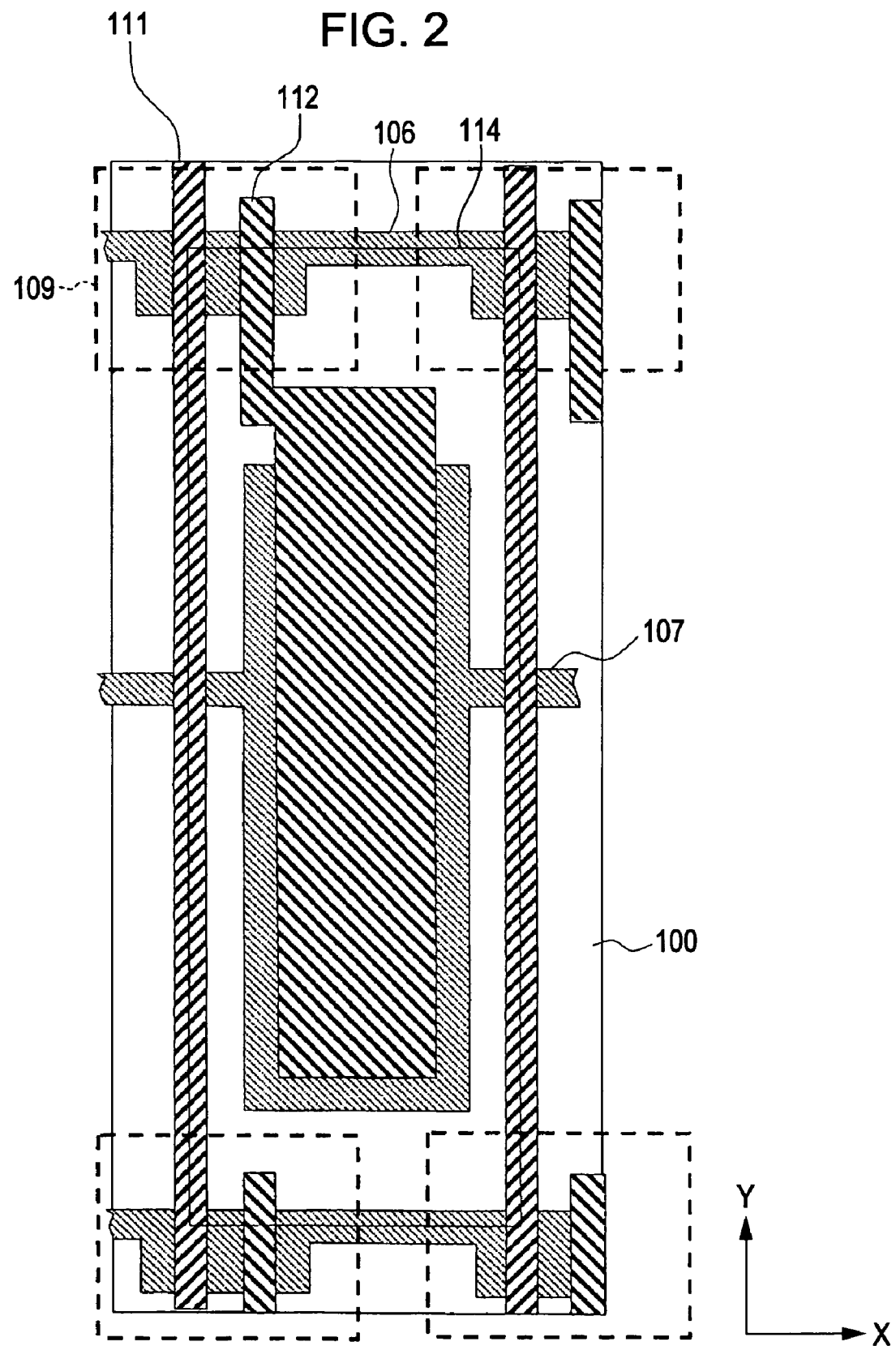
FIG. 2 is a layout plan of patterns of a transistor and a display device according to the first embodiment.

FIG. 2 is a layout plan of a pixel of the TFT array panel shown in FIG. 1B. The same reference numerals in FIG. 2 denote the same parts as in FIG. 1.

In FIG. 2, the amorphous semiconductor layer 109 is arranged at a position where the source electrode 111 and the gate electrode 106 cross each other, and on the amorphous semiconductor layer 109, the source electrode 111 and the drain electrode 112 are disposed so as to oppose each other.

The region between the opposing source electrode 111 and drain electrode 112 is a channel of the TFT.

The area 109 surrounded by a dotted line in FIG. 2 is the position where the amorphous semiconductor layer (indicated by reference numeral 109 in FIG. 1A) is disposed. The amorphous semiconductor layer 109 is formed so as to have a width larger than a width of the gate electrode 106 in the channel width direction (Y-direction). The amorphous semiconductor layer 109 in the channel has a part overlapping with the gate electrode 106 with the SiN film 108 interposed therebetween and a part not overlapping with the gate electrode 106.

The amorphous semiconductor layer 109 is influenced by the potential of the SUS substrate 100 through two insulating layers, the SiN film 108 and the substrate insulating layer 101, at the region not overlapping with the gate electrode 106. When the potential of the SUS substrate 100 is higher than that of the amorphous semiconductor layer 109 with a certain difference, a charge transfer channel is formed at the interface of the amorphous semiconductor layer 109 with the SiN film 108, and current flows depending on the voltages between the source electrode 111 and the drain electrode 112.

Namely, it can be thought that this region operates as a field-effect transistor (a second transistor) controlled by the potential of the SUS substrate, which is different from the TFT (a first transistor) controlled by the gate electrode 106. Hereinafter, this second transistor is referred to as a parasitic transistor (parasitic Tr).

Between the source electrode 111 and the drain electrode 112, a current controlled by a potential of the gate electrode 106 and a current controlled by a potential of the SUS substrate 100 flow. The sum of both currents serves as the total drain current. In other words, the parasitic Tr and the primary TFT (controlled by the gate electrode 106) can be presumed to be two transistors connected in parallel and having the source electrode and the drain electrode in common.

Figure 4A:
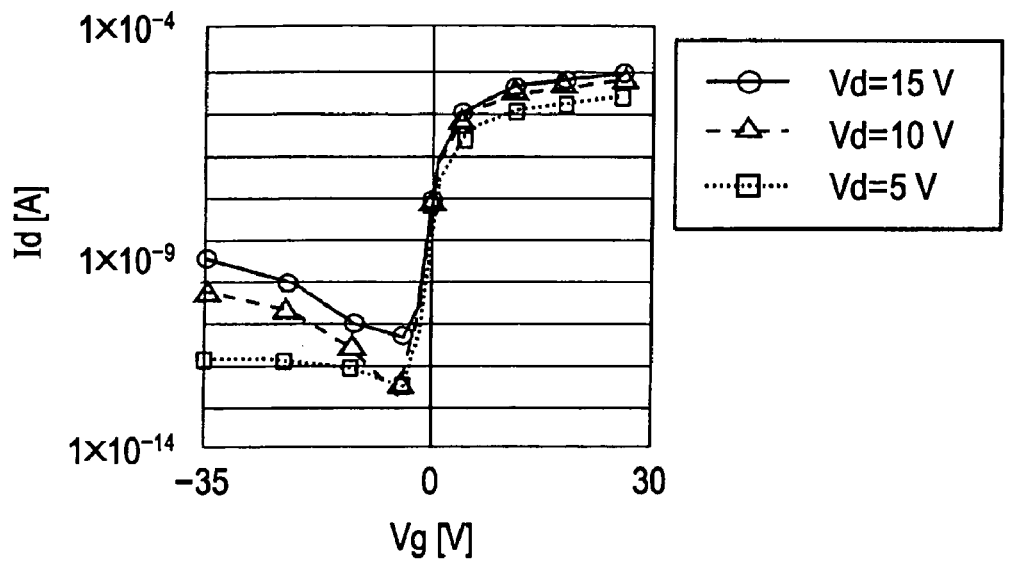
FIGS. 4A and 4B are graphs showing voltage-current characteristics of TFTs according to the first embodiment and a comparative example.

FIG. 4A is a graph showing a voltage-current characteristic (Vg-Id characteristic) of the primary TFT controlled by the gate electrode 106 when the potential of the SUS substrate 100 is set to off-voltage of the parasitic Tr. The horizontal axis of the graph represents the voltage Vg of the gate electrode 106, and the vertical axis represents the current Id flowing between the source electrode 111 and the drain electrode 112.

Figure 4B:
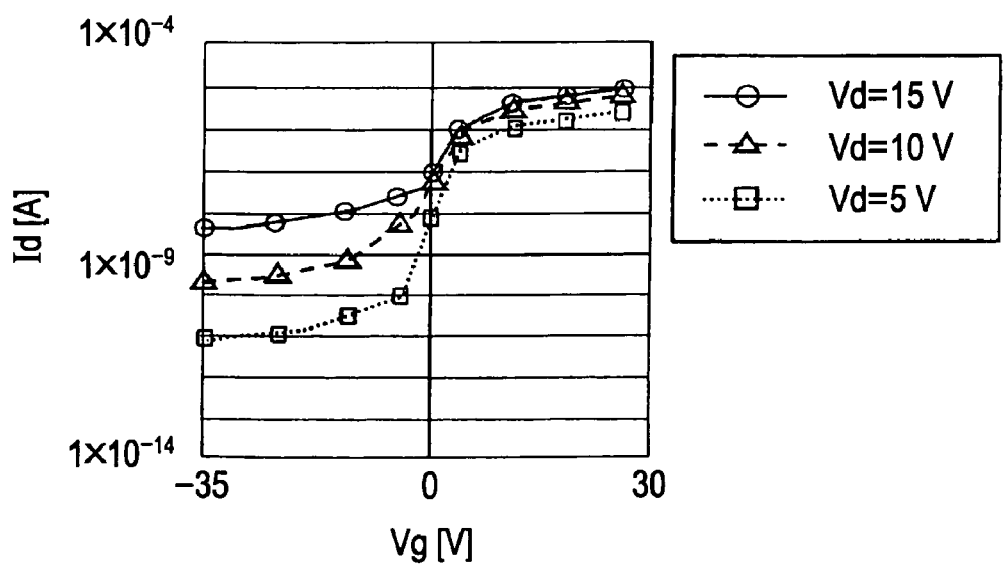

Currents flowing between the source electrode and the drain electrode were measured when the voltage of the SUS substrate 100 was set at −20 V and the voltage of the gate electrode 106 was changed in the range of −35 to +35 V at three different drain voltages Vd=5, 10, and 15 V. For comparison, a voltage-current characteristic of a TFT having the same layout of the patterns formed on an insulating substrate is shown in FIG. 4B.

All voltages are determined by using the potential of the source electrode as a reference.

In the TFT according to this embodiment (FIG. 4A), when the gate voltage Vg is an off-voltage (−20V), the drain current Id is $1 \times 10^{-10}$ A or less in every case of Vd=15, 10, and 5 V. On the other hand, in the comparative embodiment (FIG. 4B), the drain currents are 1 or 2 orders larger than the above-mentioned value. Additionally, an on/off ratio (a ratio of the drain current at Vg=+20 to that at Vg=−20 V) is in the range of 5 digits or more in the embodiment, but in the comparative example the ratio is in the range of 3 to 5 digits.

In this embodiment, since an off-voltage of −20 V is applied to the SUS substrate, a charge transfer channel is not formed at the portion for the parasitic Tr. Consequently, the leakage current is suppressed.

On the other hand, when the substrate is formed of an insulating material as in the comparative embodiment, the gate electrode for turning the parasitic Tr OFF is not present. Therefore, a leakage current flows depending on the voltage between the source and drain electrodes at the pattern region of the amorphous semiconductor layer extending off the gate electrode. Consequently, the off-current is increased compared with that of the embodiment of the present invention.

The characteristic shown in FIG. 4A can be expected to be established in an actual TFT matrix array. Therefore, in the driving of an actual TFT matrix array, the gate-line-driving circuit 125 is adjusted to apply an off-voltage (−20 V) to the SUS substrate through the wiring 124 for setting the potential of the substrate. In this state, the TFT is switched to a conductive state and a non-conductive state by applying an on-voltage of 20 V and an off-voltage of −20 V, respectively, to the gate electrode 106.

The off-voltage applied to the SUS substrate 100 may be the same off-voltage as that applied to the primary TFT using the gate electrode 106. When the leakage current of the parasitic Tr is sufficiently smaller than the operating current of the TFT, the off-voltage applied to the SUS substrate may be a voltage of a small absolute value.

Since the gate insulating film of the parasitic Tr is formed of laminated films of the SiN film 108 and the substrate insulating layer 101, the gate insulating film has a thickness larger than that of the primary TFT using the gate electrode 106. Therefore, the threshold voltage of the parasitic Tr is higher than that of the primary TFT using the gate electrode 106. Consequently, in order to simultaneously turn the parasitic Tr and the primary TFT ON or OFF, it is preferable that the on-voltage of the parasitic Tr is adjusted to a value higher than that of the TFT or the on-voltage of both are adjusted to the threshold of the parasitic voltage.

As described above, the substrate potential can be arbitrarily adjusted by using a conductive substrate, and the leakage current flowing between the source electrode and the drain electrode can be suppressed by applying a potential which is equal to the off-voltage to the SUS substrate. Thus, the characteristics of the TFT can be improved.

Since the area of the amorphous semiconductor layer 109 is larger than that of the gate electrode 106, the W/L ratio of the TFT is not changed even if displacement of the pattern of the gate electrode 106 occurs.

Figure 9:
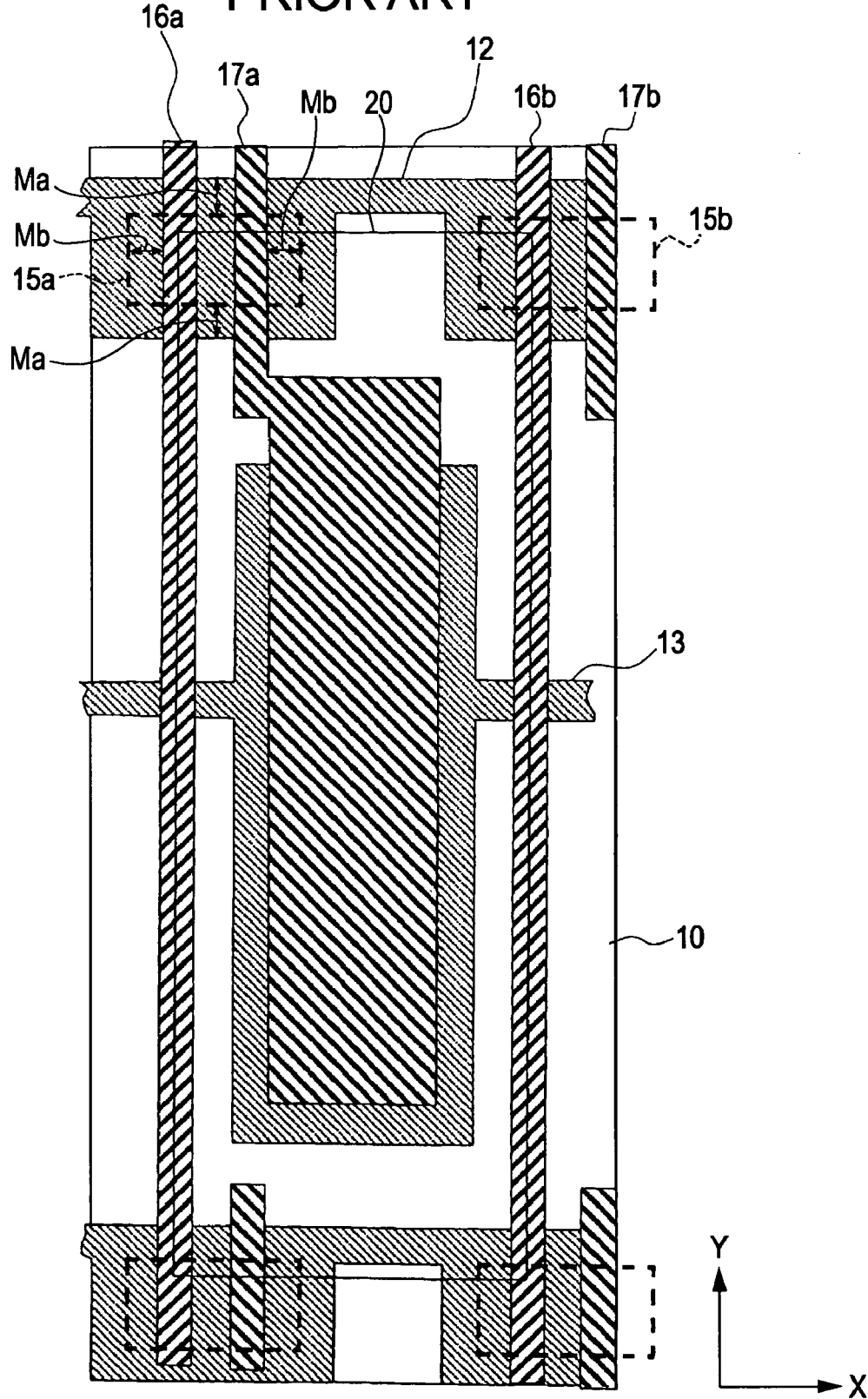
FIG. 9 is a layout plan of patterns of a transistor and a display device of a conventional display.

If the margin for displacement is widened by enlarging the pattern of the amorphous semiconductor layer so as to be larger than that of the gate electrode while maintaining the width of the gate electrode as in a conventional pattern shown in FIG. 9, the pixel size must be enlarged.

However, it is unnecessary to increase a TFT size when a width of the gate electrode is decreased while maintaining a conventional margin size.

Furthermore, by decreasing the width of the gate electrode, the TFT size can be decreased to be smaller than that of the conventional TFT and the pixel density can be increased. In addition, since the area of the TFT-forming region is decreased, the effective display area per pixel, i.e., aperture ratio per pixel, can be increased.

An example of an electrophoretic display provided with the TFT array panel shown in FIG. 1B will now be described.

Figure 3A:
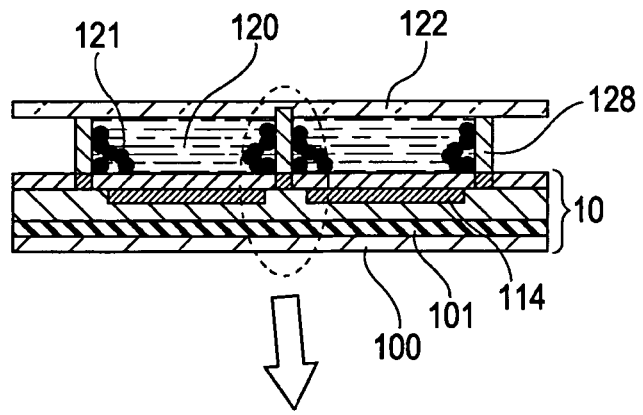
FIGS. 3A and 3B are diagrams schematically showing cross sections of an electrophoretic display device and a transistor, respectively, according to the first embodiment.
Figure 3B:
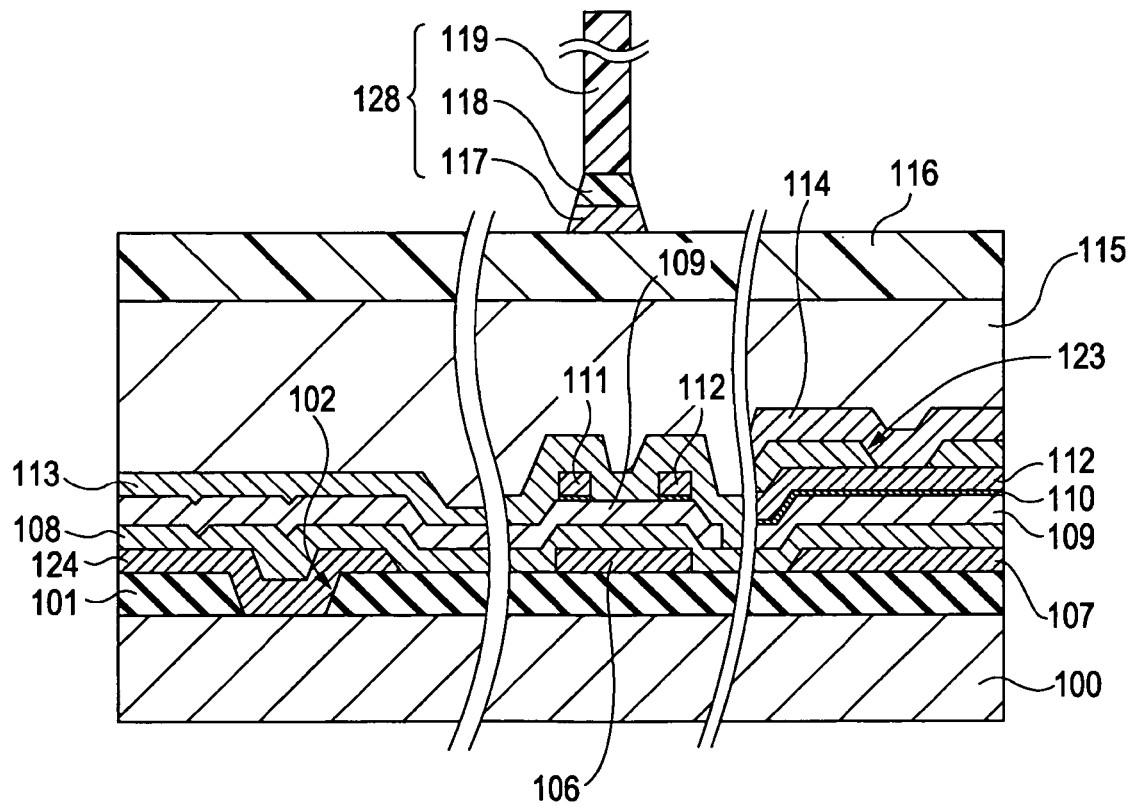

FIG. 3A is a schematic cross-sectional view of an example of an electrophoretic display. FIG. 3B is a cross-sectional view of the TFT and the electrophoretic device per pixel.

As shown in FIG. 3A, the electrophoretic display has a space defined by a transparent substrate 122 and partition walls 128 on a TFT array panel 10. In the space, a dispersion liquid prepared by dispersing charged black particles 121 in an insulating liquid 120 is sealed. The charged particles 121 are formed of a polystyrene resin containing carbon black. The insulating liquid 120 is composed principally of a paraffin-based hydrocarbon solvent.

As shown in FIG. 3B, in the TFT array panel, a pixel electrode 114, a white-scattering layer 115, and a resin layer 116 are laminated on one TFT shown in FIG. 1A. The partition wall 128 is provided on the resin layer 116 and has a structure formed of a titanium (Ti) film 117, a photoresist containing carbon (hereinafter referred to as carbon-containing resist) 118, and thick resist 119 having a thickness larger than that of the carbon-containing resist 118, in this order.

The layout plan of a pixel is the same as that in FIG. 2. A pixel electrode 114 is disposed in the center of the pixel and is connected to the drain electrode 112 via a contact hole (not shown).

By turning the TFT ON, charge is accumulated in the pixel electrode 114. When the polarity of the charge accumulated in the pixel electrode 114 is opposite to that of the charged black particles 121, the charged black particles 121 cover the pixel electrode 114 and the pixel is colored black. By turning the TFT OFF, the charge stored in the pixel electrode 114 flows out through a storage capacitor electrode 107. Then, by applying a potential with a polarity opposite to that of the charged black particles 121 to a Ti film 117, the charged black particles 121 are gathered near the partition wall 128 and the pixel is colored white.

Since the electrophoretic display has a memory function, in the display panel of pixels arrayed in the form of a matrix, firstly, a reset process is performed to clear the previous image. The reset is performed by supplying a white signal voltage to all source electrodes and applying an on-voltage to the SUS substrate to simultaneously turn all parasitic Trs ON. By this process, all pixels are applied with the white signal voltage and the entire screen is reset to white.

A large quantity of current flows in the pixels, and by simultaneously applying the on-voltage to all parasitic Trs which utilize the SUS substrate as a gate electrode, the reset operation is quickly achieved.

After the reset operation, a scanning signal is sequentially applied to the gate electrodes 106 and the display signal voltage is charged to the pixel electrodes of the electrophoretic display.

A method of manufacturing the electrophoretic display shown in FIGS. 3A and 3B will now be described.

A SiN film having a thickness of 300 nm is formed by a chemical vapor deposition (CVD) method as a substrate insulating layer 101 on a SUS substrate 100 having a board thickness of 0.2 mm. A photoresist having a predetermined pattern of a hole is formed on the substrate insulating layer 101 by a lithography process, and then a contact hole 102 is formed in the substrate insulating layer 101 by dry etching to expose a part of the SUS substrate 100 as shown in FIG. 3B.

After removing the photoresist, an Al—Nd film having a thickness of 200 nm is deposited by sputtering on the substrate insulating layer 101. Then, a photoresist having a predetermined pattern is formed by a lithography process. The Al—Nd film is etched by using the photoresist as a mask to form a gate electrode 106, a storage capacitor electrode 107, and wiring 124 for setting a potential of the substrate. Then, the photoresist is removed. Since the electrophoretic display in this embodiment needs a storage capacitor for keeping the TFT turned on, the storage capacitor electrode 107 is formed in the same layer where the gate electrode 106 is formed. Via a contact hole 102, the SUS substrate 100 is electrically connected to the substrate-potential-setting wiring 124. Here, the selective removal of the substrate insulating layer 101 is conducted by dry etching, but is not limited to this. Any method can be employed as long as the SUS substrate 100 and the substrate-potential-setting wiring 124 are electrically connected to each other.

A SiN film 108 having a thickness of 150 nm is formed by the CVD method as a gate insulating film, and then an amorphous semiconductor layer 109 having a film thickness of 200 nm is formed by the CVD method. An amorphous silicon (a-Si(n$^+$)) film having a thickness of 20 nm is formed by the CVD method as an ohmic contact layer 110. The ohmic contact layer 110 may be formed by ion implantation of conductive impurities in the surface of the amorphous semiconductor layer 109. Then, an Al film having a thickness of 200 nm is deposited by sputtering on the ohmic contact layer 110.

A photoresist for patterning a source electrode 111 and a drain electrode 112 is formed by the lithography process, and then the Al film is wet etched by using the photoresist as a mask to form patterns of the source electrode 111 and the drain electrode 112 on the Al film. Subsequently, the ohmic contact layer 110 is dry etched by using the same photoresist as a mask to remove the ohmic contact layer 110 other than regions for the source electrode 111 and the drain electrode 112. Thus, the ohmic contact layer 110 at a region where a channel is formed is removed.

After forming patterns of the source electrode 111 and the drain electrode 112 on the Al film and the ohmic contact layer 110, the photoresist is removed. Then, a photoresist for forming a pattern of an amorphous semiconductor layer 109 is formed. By using this pattern as a mask, the amorphous semiconductor layer 109 is dry etched to form the pattern of the amorphous semiconductor layer 109 shown in FIG. 2.

When the pattern of the amorphous semiconductor layer 109 is formed by the dry etching, the Al film pattern of the source electrode 111 and the drain electrode 112 in addition to the photoresist serve as an etching mask. Therefore, the amorphous semiconductor layer 109 remains selectively at a region where the amorphous semiconductor layer 109 overlaps with the pattern of the source electrode 111 or the drain electrode 112.

After the pattern of a TFT is formed as described above, a SiN film 113 of 300 nm thick for covering over the amorphous semiconductor layer 109, the source electrode 111, and the drain electrode 112 is formed on the SiN film 108. Then, a photoresist having a predetermined pattern of a hole is formed by a lithography process, and a contact hole 123 as shown in the pixel-electrode-forming region in FIG. 3B is formed in the SiN film 113 by dry etching using the photoresist as a mask. Thus, a part of the drain electrode 112 is exposed. After the removal of the photoresist, an Al film having a thickness of 200 nm is deposited by sputtering on the SiN film 113.

A photoresist having a predetermined pattern is formed on the Al film by the lithography process, and the Al film was wet etched to form a pixel electrode 114. After removing the photoresist, a white-scattering layer 115 having a film thickness of 4 µm is formed by the application of an acrylic resin containing $TiO_2$. On the white-scattering layer 115, an acrylic resin layer 116 having a film thickness of 1 µm is formed as an insulating film.

A Ti film 117 having a thickness of 300 nm is formed on the resin layer 116, and a carbon-containing resist 118 having a thickness of 300 nm is formed on the Ti film 117. Then, a thick resist 119 having a thickness of 15 µm is formed on the carbon-containing resist 118. In order to form a partition wall 128 between pixels, the exposure and development are conducted so that a pattern of the thick resist 119 is retained at the region between pixels. The Ti film 117 and the carbon-containing resist 118 are etched by a thickness of 300 nm, respectively, using the resulting pattern of the thick resist 119 as a mask. Thus, the partition wall 128 is formed.

A dispersion liquid prepared by dispersing charged black particles 121 in an insulating liquid 120 is packed in a region partitioned by the partition walls 128. A transparent substrate 122 is put on the apexes of the partition walls 128 and fixed to the partition walls 128 with an adhesive agent (not shown). Thus, the electrophoretic display is manufactured.

In the method for manufacturing the electrophoretic display in this embodiment, high dimensional and positioning accuracies are not required as long as the photoresist is formed so as to cover the pattern of the gate electrode 106 in the lithography process for forming the pattern of the amorphous semiconductor layer 109.

Second Embodiment

In this embodiment, a glass substrate is used instead of the SUS substrate in the first embodiment. The glass substrate is electrically non-conductive, but the whole surface of the glass substrate is provided with a metal layer to obtain conductivity. A glass substrate having a low coefficient ($\alpha$) of linear expansion is used.

A structure of the electrophoretic display will now be described with reference to the embodiment.

Figure 5A:
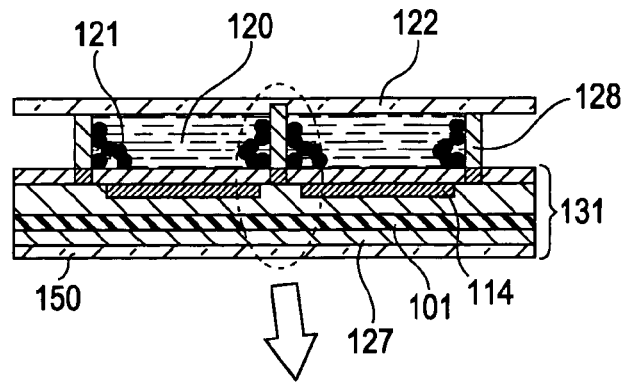
FIGS. 5A and 5B are diagrams schematically showing cross sections of an electrophoretic display device and a transistor, respectively, according to a second embodiment of the present invention.
Figure 5B:
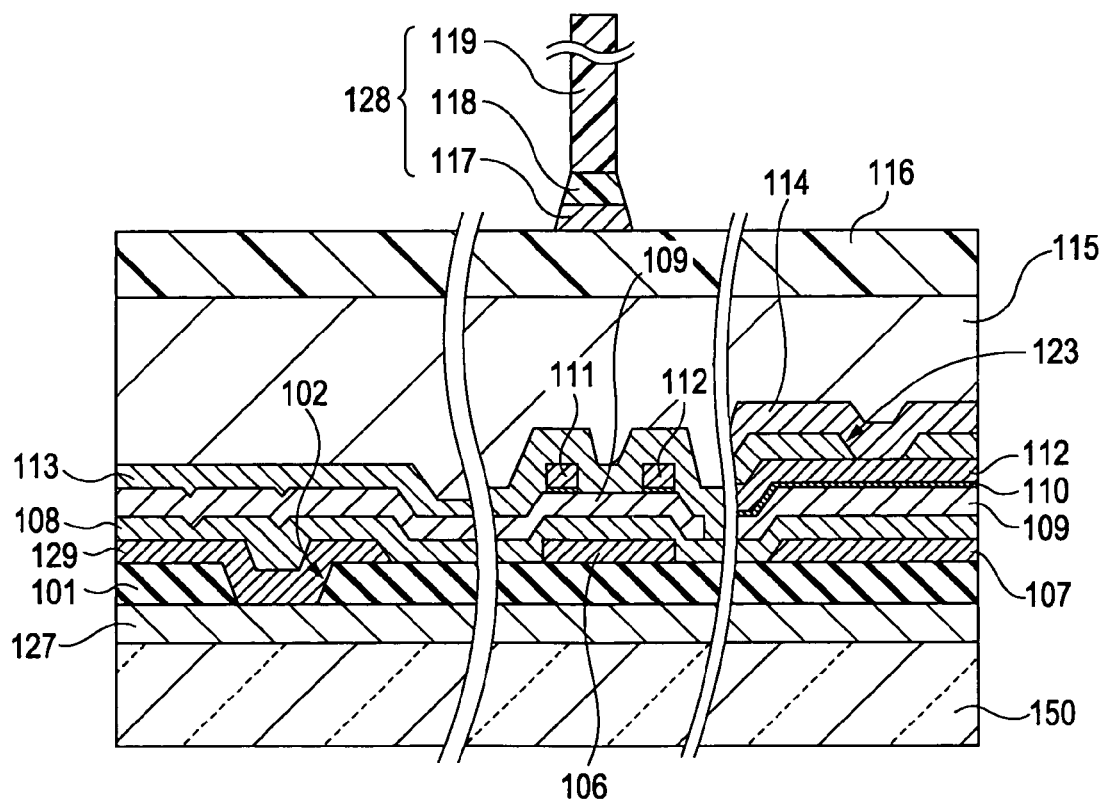

FIGS. 5A and 5B are schematic cross-section views of an electophoretic display using a TFT array panel according to this embodiment. The same reference numerals in this embodiment denote similar structures as in the First Embodiment, and the detailed description is omitted. FIG. 5A shows a cross section of electrophoretic cells, and FIG. 5B shows a cross section of a TFT array panel.

As shown in FIG. 5A, in the TFT array panel 131, has an electrically conductive layer formed of Cr (Cr electrode 127) is disposed on a glass substrate 150 with a low coefficient of linear expansion, and a substrate insulating layer 101 is disposed on the Cr electrode 127. The substrate insulating layer 101 is provided with a contact hole 102, and via this contact hole 102, the Cr electrode 127 is electrically connected to wiring 129 for setting a potential of the Cr electrode 127. Other parts are the same as those in the First Embodiment.

A gate electrode 106 and an amorphous semiconductor layer 109 in this embodiment have the same patterns and layouts as those of the gate electrode and the amorphous semiconductor layer shown in FIG. 2. In addition, in the TFT array panel 131 in this embodiment, the amorphous semiconductor layer 109 is formed in the channel so as to have a width larger than a width of the gate electrode 106 in the channel width direction, and the amorphous semiconductor layer 109 in the channel also has a part overlapping with the gate electrode 106 and a part not overlapping with the gate electrode 106. Thus, a parasitic Tr is formed at the part where the amorphous semiconductor layer 109 does not overlap with the gate electrode 106. In this embodiment, the Cr electrode 127 serves as a gate electrode of the parasitic Tr. A SiN film 108 serving as a gate insulating film of the primary TFT and a substrate insulating layer 101 disposed under the SiN film 108 function as gate insulating films of the parasitic Tr as in the First Embodiment.

A gate-line-driving circuit 125 applies an off-voltage to the Cr electrode 127 through the wiring 129 in order to suppress the leakage current flowing between the source electrode and the drain electrode when the TFT is OFF, as in the First Example.

In this embodiment, the gate electrode 106 of the TFT and the Cr electrode 127 are simultaneously applied with the same on-voltage when a resetting operation is performed before scanning of a display panel. By this operation, the drain current of the TFT, in addition to the drain current of the parasitic Tr, flows; thus, the total drain current is increased. As a result, operation after the resetting is quickly conducted. The on-voltage is set to a threshold voltage of the parasitic Tr. Additionally, the gate electrode 106 of the TFT and the Cr electrode 127 are also applied with the same off-voltage. By this operation, commonality between a substrate-voltage-generating circuit and a gate-signal-line-driving circuit can be achieved. Consequently, the circuit can be simplified.

A method for manufacturing the electrophoretic display shown in FIG. 5A will now be briefly described.

A Cr electrode 127 having a film thickness of 100 nm is deposited by sputtering on a glass substrate 150 having a low coefficient of linear expansion and a board thickness of 0.7 mm, and a SiN film having a thickness of 500 nm is formed by the CVD method as a substrate insulating layer 101.

Then, as in the First Embodiment, a contact hole 102 is formed in the substrate insulating layer 101, and an Al—Nd film having a thickness of 200 nm is formed on the substrate insulating layer 101 by sputtering. Furthermore, wiring 129 is formed so that the Al—Nd film electrically connects between a gate-line-driving circuit 125 and the Cr electrode 127. The subsequent process is conducted as in the First Example. Here, Cr is used as a metal material, but electrically conductive materials such as Al—Nd and Mo may be used.

The gate-line-driving circuit 125 applies an on-voltage of 20 V to the Cr electrode 127 through the wiring 129 to turn the TFT ON. At the same time, the gate-line-driving circuit 125 applies an on-voltage of 20 V to the gate electrode 106. By this operation, an on-current flows between the source electrode 111 and the drain electrode 112 of the TFT, and also a current flows in the parasitic Tr. As a result, the pixel electrode 114 is charged with the currents of both the TFT and parasitic Tr.

On the other hand, the gate-line-driving circuit 125 applies an off-voltage of −20 V to the Cr electrode 127 through the wiring 129 to turn the TFT OFF. At the same time, the gate-line-driving circuit 125 applies an off-voltage of −20 V to the gate electrode 106. By this operation, the TFT is turned OFF, and the parasitic Tr is also turned OFF as a result of the application of a voltage of −20V to the Cr electrode 127 functioning as the gate electrode of the parasitic Tr. As a result, the charge accumulated in the capacitor can be retained, and the leakage current flowing between the source electrode 111 and the drain electrode 112 can be suppressed when the TFT is OFF.

Figure 6A:
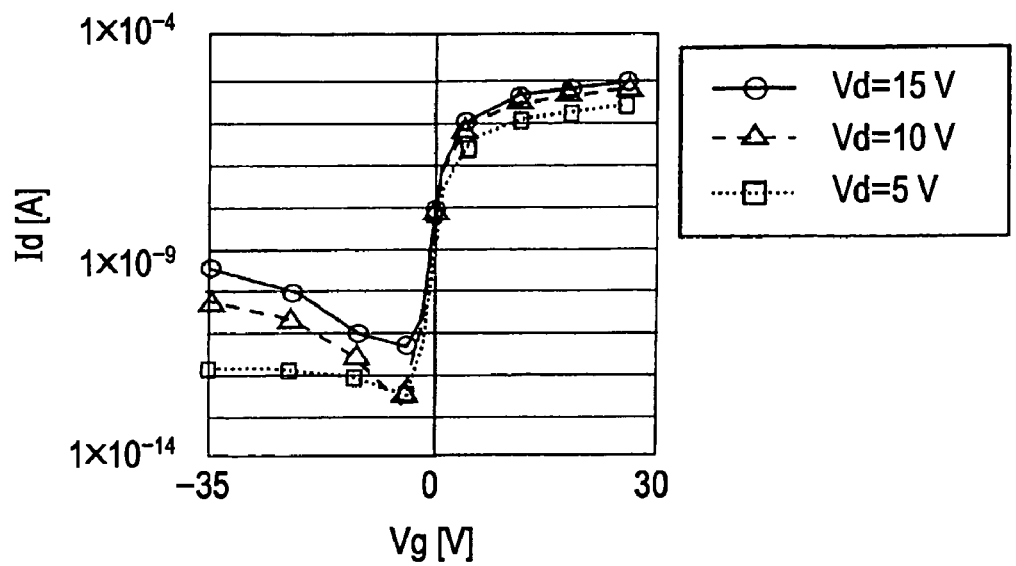
FIGS. 6A and 6B are graphs showing voltage-current characteristics of the transistor according to the second embodiment when an off-voltage is applied to the substrate and when an on-voltage is applied to the substrate, respectively.
Figure 6B:
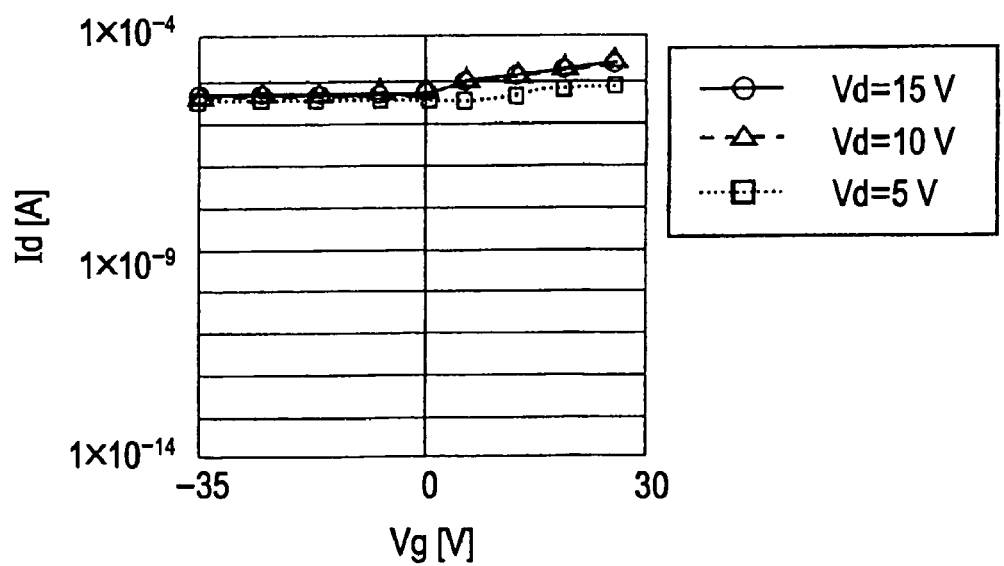
Figure 7A:
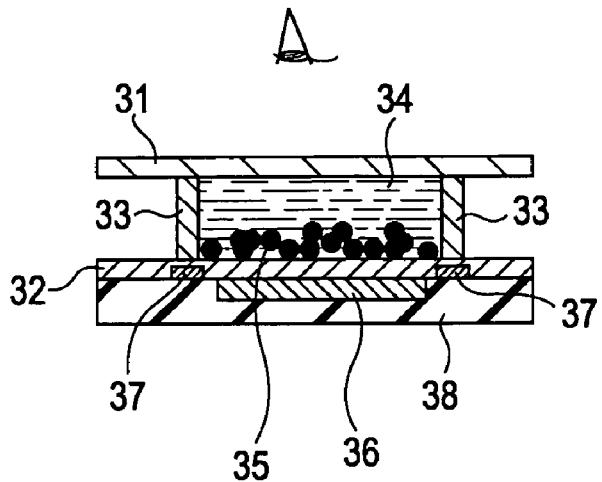
FIGS. 7A and 7B are block diagrams of a conventional electrophoretic display.
Figure 7B:
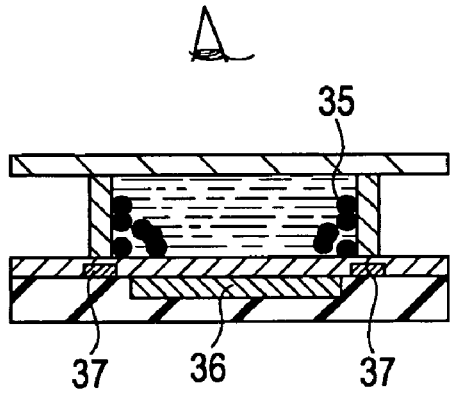
Figure 8:
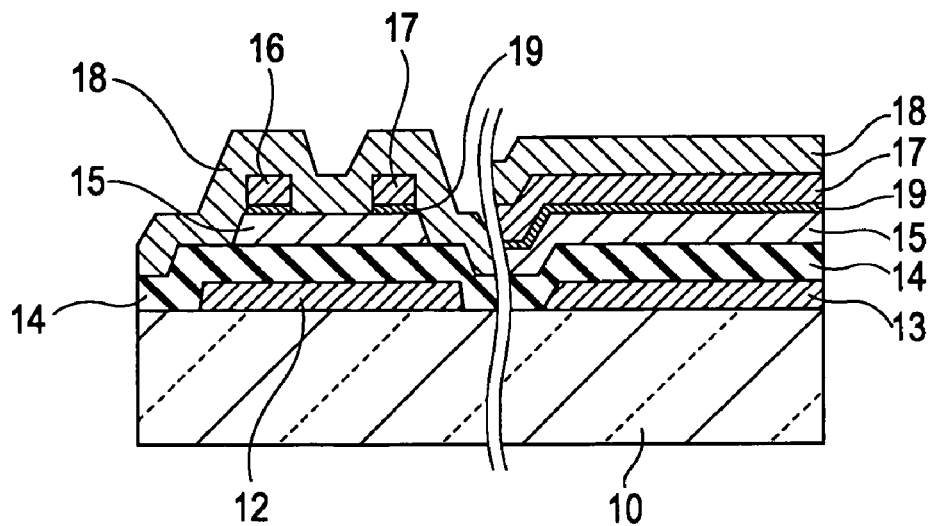
FIG. 8 is a diagram schematically showing a cross section of a conventional transistor.

FIGS. 6A and 6B are graphs showing a Vg-Id characteristic of the TFT according to this embodiment. The horizontal axis of the graph represents the gate voltage Vg, and the vertical axis represents the drain current Id. FIG. 6A shows the drain current Id when the Cr electrode 127 is applied with an off-voltage (−20 V) and the gate voltage Vg is changed in the range of −35 to +35 V. FIG. 6B shows the drain current Id when the Cr electrode 127 is applied with an on-voltage (+20 V) and the gate voltage Vg is changed in the same way as above. The current Id shown in FIGS. 6A and 6B are the sum of a current in the TFT and a current in the parasitic Tr. The voltages between the source and drain electrodes are three different voltages: Vd=5, 10, and 15 V. All voltages are determined by using the potential of the source electrode as a reference.

As shown in FIG. 6A, when the voltage of the Cr electrode 127 is an off-voltage (−20 V), the drain current Id changes with a change in the gate voltage Vg, and the Id in the OFF state is $1\times10^{-10}$ A or less.

On the other hand, as shown in FIG. 6B, when the voltage of the Cr electrode 127 is an on-voltage (20 V), the drain current Id is constant, approximately $8\times10^{-6}$ A, regardless of the level of the gate voltage.

With reference to the graph shown in FIG. 6B, it is thought that a conduction channel is formed by applying an on-voltage to the Cr electrode 127 at a portion of the amorphous semiconductor layer 109 where the amorphous semiconductor layer 109 does not overlap with the gate electrode 106 between the source and drain electrodes. Additionally, it is thought that since this current is large, the switching operation of the gate electrode is hidden in FIG. 6B.

In this embodiment, an insulating substrate is used by forming an electrically conductive layer thereon. However, it is readily predicted that such a substrate used in the structure described in the First Embodiment can turn the parasitic Tr ON and a current-voltage characteristic similar to that in the First Embodiment can be achieved.

A TFT array panel according to this embodiment can be applied to a liquid-crystal display. In such a case, the display can be conducted by forming a common electrode of a transparent conductive film such as an Indium-Tin-Oxide (ITO) film on a surface of a transparent glass substrate 122 at the display side, interposing a liquid crystal between the transparent glass substrate and the TFT substrate, connecting the drain electrode of the TFT to the pixel electrode, and applying a voltage between the pixel electrode and the common electrode.

In the First and Second Embodiments, a reverse stagger type using amorphous silicon, so-called bottom-gate type TFT is exemplarily described, but other types can be applied without any problems. For example, a top-gate type TFT can achieve a similar efficiency. In the structure of the top-gate type TFT, an electric field can be applied to an amorphous semiconductor layer through a substrate insulating layer by controlling a voltage applied to an electrically conductive substrate. Thus, structures of the TFT are not limited to the structure described in these embodiments.

In the embodiments, the semiconductor layer of the TFT is formed of amorphous silicon, but is not limited this. A laser annealed polysilicon TFT of which amorphous silicon treated with laser annealing may be used. Furthermore, a single crystal TFT utilizing transfer technology may be used. In any case, an effect similar to that of the embodiment according to the present invention can be achieved.

In addition, a glass substrate having a low coefficient of linear expansion is used as an insulating substrate, but any glass substrate for displays can be used without any restriction by the value of the coefficient of linear expansion. Furthermore, a plastic substrate can be used. In a transmissive TFT array, a bottom electrode provided on an insulating substrate may be a transparent electrode formed of ITO or indium zinc oxide (IZO).

While the present invention has been described with reference to exemplary embodiments, it is to be understood that the invention is not limited to those embodiments. The scope of the following claims is to be accorded the broadest interpretation so as to encompass all modifications, equivalent structures and functions.

This application claims the benefit of Japanese Application No. 2005-164028 filed Jun. 3, 2005, which is hereby incorporated by reference herein in its entirety.

What is claimed is:

1. A method for driving a display,
   wherein the display includes:
   a transistor away panel having at least:

an electrically conductive substrate having a surface coated with a first insulating film, a plurality of field-effect transistors arrayed on the surface of the electrically conductive substrate in a form of a matrix, each of the plurality of field-effect transistors including:

a first insulating film coating at least a portion of the electrically conductive substrate;

a gate electrode disposed on the electrically conductive substrate with the portion of the first insulating film;

a second insulating film covering the gate electrode and the portion of the first insulating film;

a semiconductor layer disposed on the second insulating film; and a source electrode and a drain electrode disposed on the semiconductor layer opposite to each other, the source and drain electrodes contacting the semiconductor layer at two separate regions defining a channel therebetween, wherein the semiconductor layer in the channel has a part overlapping with the gate electrode and a part not overlapping with the gate electrode, wherein a width of the part of the semiconductor layer overlapping with the gate electrode is smaller than a width of the channel, wherein the part of the semiconductor layer overlapping with the gate electrode constitutes a first field-effect transistor, a current of which is controlled by a potential of the gate electrode, and wherein the part of the semiconductor layer not overlapping with the gate electrode constitutes a second field-effect transistor, a current of which is controlled by a potential of the conductive substrate, and a wiring for applying a voltage to the electrically conductive substrate;

a plurality of display devices driven by the transistor array panel;

a gate-line-driving circuit for supplying a scanning signal voltage to each gate electrode;

a source-line-driving circuit for supplying an image signal voltage to each source electrode; and a substrate-voltage-generating circuit for supplying a voltage to the wiring, and wherein the method comprises steps of:

turning each field-effect transistor arrayed in the form of a matrix into a state in which the field-effect transistor is controlled by a voltage applied to the gate electrode by supplying a voltage to the electrically conductive substrate from the substrate-voltage-generating circuit, for a duration of time that the gate-line-driving circuit is supplying a scanning signal voltage to the gate electrode; and resetting all display devices arrayed in a form of a matrix to display identical views by supplying a voltage for commonly placing all field-effect transistors arrayed in the form of a matrix in a conductive state to the electrically conductive substrate from the substrate-voltage-generating circuit, before the gate-line-driving circuit supplies a scanning signal voltage to the gate electrode.

* * * * *